(12) United States Patent
Duggan

(10) Patent No.: US 7,424,281 B1
(45) Date of Patent: Sep. 9, 2008

(54) IMAGE-REJECTION MIXERS HAVING HIGH LINEARITY AND HIGH GAIN AND RF CIRCUITS USING THE SAME

(75) Inventor: Bernard Duggan, Swindon (GB)

(73) Assignee: Maxim Integrated Products, Inc., Sunnyvale, CA (US)

( * ) Notice: Subject to any disclaimer, the term of this patent is extended or adjusted under 35 U.S.C. 154(b) by 448 days.

(21) Appl. No.: 11/289,033

(22) Filed: Nov. 29, 2005

Related U.S. Application Data

(63) Continuation-in-part of application No. 10/269,393, filed on Oct. 11, 2002, now Pat. No. 7,043,220.

(51) Int. Cl.
*H04B 1/10* (2006.01)

(52) U.S. Cl. .................. 455/302; 455/313; 455/323; 327/113

(58) Field of Classification Search .......... 455/302, 455/307, 313, 323, 326, 334, 63.1, 67.13, 455/296; 327/100, 113, 119, 356
See application file for complete search history.

(56) References Cited

U.S. PATENT DOCUMENTS

| | | | | |
|---|---|---|---|---|
| 4,723,318 | A * | 2/1988 | Marshall | ............ 455/306 |
| 5,570,056 | A | 10/1996 | Groe | |
| 5,589,791 | A | 12/1996 | Gilbert | |
| 5,884,154 | A | 3/1999 | Sano et al. | |
| 6,285,865 | B1 | 9/2001 | Vorenkamp et al. | |
| 6,404,281 | B1 | 6/2002 | Kobayashi | |
| 6,438,365 | B1 | 8/2002 | Balteanu | |
| 6,785,528 | B2 * | 8/2004 | Carpineto | ............ 455/323 |
| 6,882,191 | B2 * | 4/2005 | Kwok | ............ 327/113 |

OTHER PUBLICATIONS

Gingell, M.J., "Single Sideband Modulation using Sequence Asymmetric Polyphase Networks", Electrical Communication, 1973, pp. 21-25, vol. 48, No. 1 and 2.
Sansen, Willy M.C. et al., "An Integrated Wide-Band Variable-Gain Amplifier with Maximum Dynamic Range", IEEE Journal of Solid-State Circuits, Aug. 1974, pp. 159-166, vol. SC-9, No. 4.
Behbahani, Farbod et al., "CMOS Mixers and Polyphase Filters for Large Image Rejection", IEEE Journal of Solid-State Circuits, Jun. 2001, pp. 873-887, vol. 36, No. 6.

\* cited by examiner

*Primary Examiner*—Quochien B Vuong
(74) *Attorney, Agent, or Firm*—Blakely Sokoloff Taylor & Zafman LLP

(57) ABSTRACT

An integrated semiconductor image-rejection mixer having high linearity and high gain. In addition to the components of a classic image-rejection architecture, the present mixer has a high-frequency current-diverting stage that permits the operation of the output stage with high conversion gain and sufficient headroom for good linearity, even in cases where the supply voltage is relatively low (such as 3 V). The conversion gain of the mixer and its image-rejection performance can be changed by changing the load resistances and the elements of the output polyphase network, with minor effects on linearity and no change in power consumption or DC levels. The power consumption of the image-rejection mixer is low because no additional DC current is required for buffers or amplifier stages. A direct upconversion double quadrature mixer stacked with an RF VGA and load tank using an R-C, R-6C single pole current mode signal path I/Q combiner and employing a common stage as both the IQ combiner termination and the VGA control point is also disclosed.

4 Claims, 11 Drawing Sheets

IMAGE-REJECTION MIXERS HAVING HIGH LINEARITY AND HIGH GAIN AND RF CIRCUITS USING THE SAME

CROSS-REFERENCE TO RELATED APPLICATION

This application is a continuation-in-part of U.S. patent application Ser. No. 10/269,393 filed Oct. 11, 2002, now U.S. Pat. No. 7,043,220.

BACKGROUND OF THE INVENTION

1. Field of the Invention

The present invention relates to the field of image-rejection mixers.

2. Prior Art

When an RF (radio frequency) signal comprising a plurality of channels of information on different frequencies is down shifted to downshift the desired channel to a predetermined IF (intermediate frequency) frequency (actually a frequency range), one or more other channels may be downshifted to fall into the same IF frequency range. In particular, consider an RF frequency band being downshifted by mixing with another frequency $f_{LO}$. The mixing will provide sum and difference frequencies. For downshifting, the sum frequencies will be well above any frequency range of interest and easily filtered out of the resulting signal. For the difference frequencies however, when one or more channels in the RF signal are downshifted to the IF frequency range $f_{IF}$, one or more other channels in the RF signal that are $2f_{IF}$ away from the channels downshifted to the IF frequency range will appear in the –IF frequency range. Actually either of these IF frequency band signals could be the desired signal, depending on the application, with the other being commonly referred to as the image frequency or frequencies.

Once the image frequencies are combined with the desired signal, they cannot be separated, or the image frequencies eliminated. One approach for avoiding this is to bandpass filter the RF signal to eliminate the image frequencies from the RF signal prior to the mixer. This is difficult however, because of the sharp and variable frequency filters required. Another approach is to use what are referred to a image-rejection mixers, which by their design, will pass the desired downshifted signals and automatically eliminate the image frequencies from the image-rejection mixer output.

Two classic architectures for image-rejection mixing are shown in FIG. 1 and FIG. 2 ("CMOS Mixers and Polyphase Filters for Large Image Rejection", F. Behbahani et al., IEEE Journal of Solid-State Circuits, Vol. 36, No. 6, June 2001). These mixers are composed of two mixing cells $MC_1$ AND $MC_2$, two 90° phase shifters and a local oscillator signal LO. In FIG. 1, the local oscillator signal LO is applied to both mixers $MC_1$ AND $MC_2$, but shifted 90° with respect to one of the two mixers. In FIG. 2, the local oscillator signal LO is applied to both mixers $MC_1$ AND $MC_2$ without phase shift, but the RF signal is shifted 90° with respect to one of the two mixers. By proper selection of the direction of the phase shifts, the components of the IF OUTPUT in the two signal paths through the image-rejection mixer in the desired frequency band will add to create the IF OUTPUT, whereas the components of the IF OUTPUT in the two signal paths through the image-rejection mixer in the image frequency band will subtract, and therefore be eliminated from the IF OUTPUT.

Because image-rejection mixers must sometimes operate over relatively wide frequency ranges, the 90° phase shifters are commonly implemented in semiconductor integrated circuits using polyphase networks ("Single-Sideband Modulation Using Sequence Asymmetric Polyphase Network", M. J. Gingell, Electrical Communication, Vol. 48, No. 1 and 2, 1973). For high gain, the mixing cells are commonly implemented in such circuits using Gilbert-type mixers (U.S. Pat. No. 5,589,791).

Although both the polyphase networks and the Gilbert mixers have indisputable advantages as individual subcircuits, a direct implementation of an image-rejection mixer using these components has several drawbacks. An example is shown in FIG. 3, which shows a direct implementation of the diagram in FIG. 1. In FIG. 3, the RF stage is composed of npn transistors $Q_1$-$Q_4$ and degeneration resistors R. The inphase and quadrature local oscillators signals $V_{LOI}$ and $V_{LOQ}$ drive the mixers (mixing quads $MQ_1$ and $MQ_2$), and the output polyphase network has k sections consisting of resistors $R_{PN1}$-$R_{PNk}$ and capacitors $C_{PN1}$-$C_{PNk}$. Only one of the output voltages $v_{OUT1}$ and $v_{OUT2}$ is used as the output of the image-rejection mixer. In FIG. 3, $Q_1$, $Q_3$, $MQ_1$ and $Q_2$, $Q_4$, $MQ_2$ are Gilbert-type mixers (mixing cells $MC_1$ and $MC_2$ in FIG. 1). First of all, if high linearity (high third-order input-referred intermodulation point, or IIP3) is desired for the image-rejection mixer, then degeneration must be used in the RF stage as shown, and that will limit the available headroom to the output stage (thus limiting the maximum achievable value for IIP3). The degeneration in the RF stage also reduces the conversion gain of the mixer. For bigger headroom and therefore better linearity (IIP3), the tail current source ($4_{I0}$) may be absent, as the tail node may be connected directly to ground or to a tank circuit (whose resonant frequency is the RF frequency). More importantly, however, because the output polyphase network and the load resistors are in the DC current path of the output stage, the output headroom is severely reduced. especially in the case of low-voltage circuits with multiple-section polyphase networks, thereby reducing the linearity of the mixer. Increasing the output headroom is possible by reducing the load resistances and the resistances in the polyphase networks, but by doing this the conversion gain of the mixer is also reduced. Restoring the conversion gain is possible using additional gain stages at the output, with the drawback of having to use more supply current.

A possibility for avoiding the output headroom problem of the circuit in FIG. 3 is shown in FIG. 4, where the output polyphase network is taken out of the DC path of the quad collector currents and driven by two differential buffers $BUF_1$ and $BUF_2$. The drawback of this approach is that more supply current is needed for the buffers, especially for minimizing the linearity (IIP3) degradation that occurs at the buffer/polyphase network interface.

When up shifting from baseband to an RF frequency, rejection of the image frequencies is also desired. In the prior art, separate up-converters, polyphase filters and variable gain amplifiers have been used. Separate circuits for these functions consume more power and have a lower gain than the present invention.

DETAILED DESCRIPTION OF THE PREFERRED EMBODIMENTS

In the description to follow, references may be made to local oscillator signals, or inphase and quadrature local oscillator signals, such as $L_{OI}$ and $L_{OQ}$ shown in the various Figures to be described herein. It is to be understood that such references are for purposes of convenience and not for purposes of limitation, as such local oscillator signals, by way of example, may be derived from an oscillator accompanying the image-rejection mixer, or may be made available locally from a remote source, such as over a wire connection or a wireless connection, or may even be recovered from the RF signal itself, all as is well known in the art. The source of the local oscillator signal is dependent on the application of the present invention, not the invention itself, and is simply to be distinguished from the RF signal itself.

Figure 1:
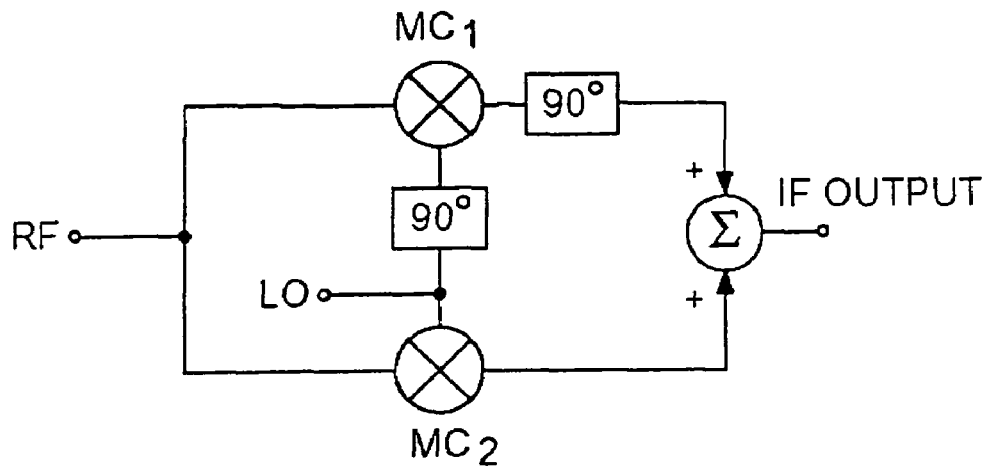
FIG. 1 is diagram illustrating a prior art image-rejection mixer architecture.
Figure 2:
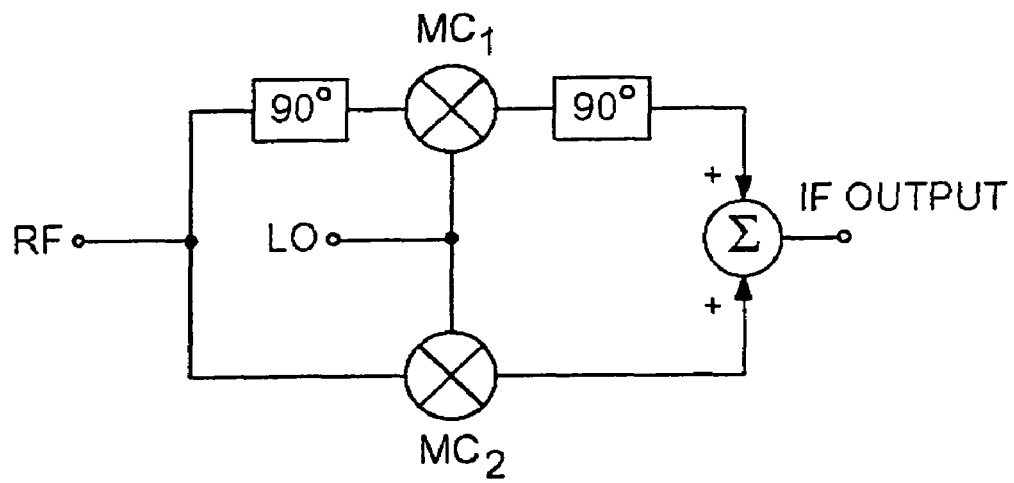
FIG. 2 is a diagram illustrating another prior art image-rejection mixer architecture.
Figure 3:
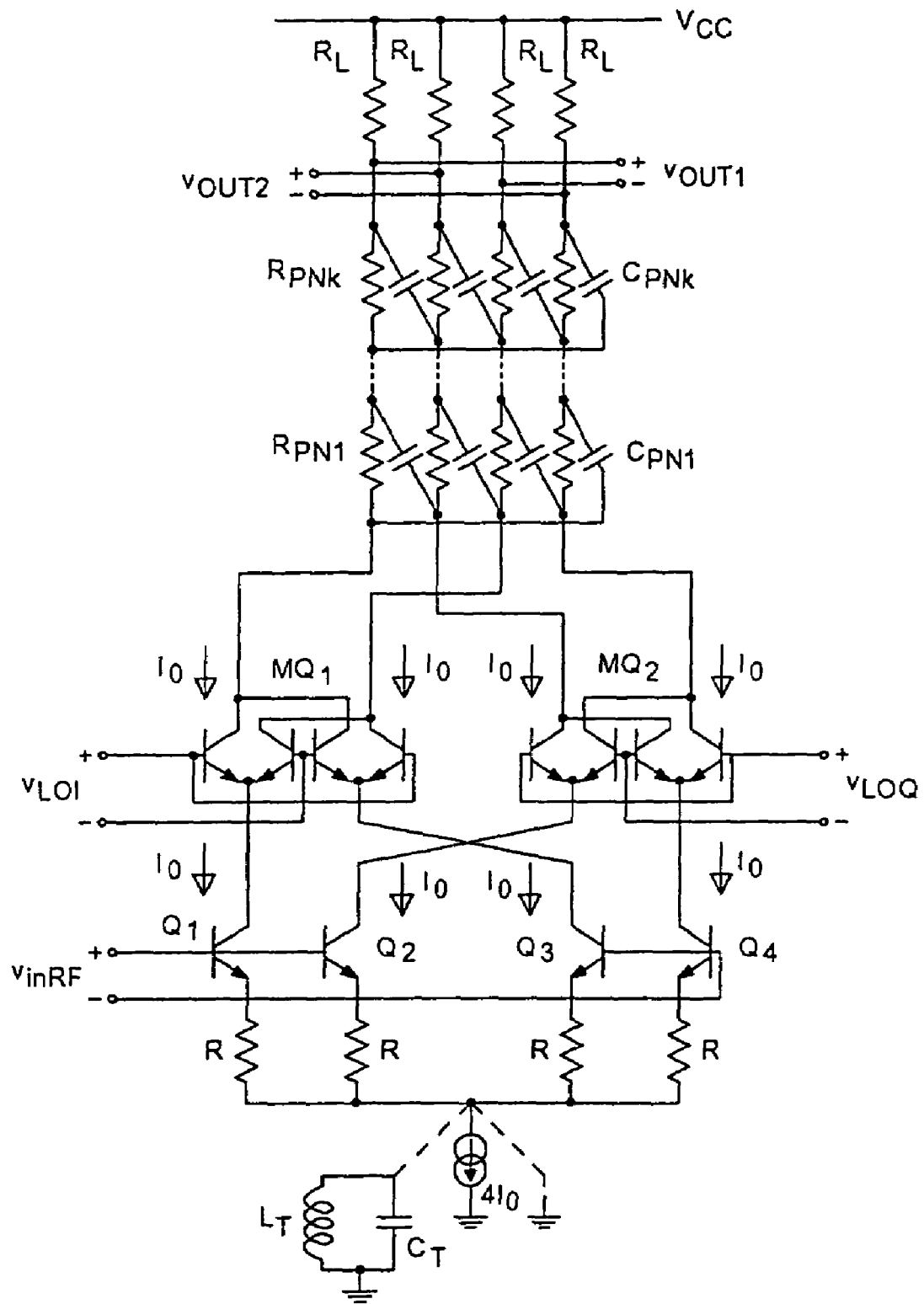
FIG. 3 is a direct implementation of the architecture of FIG. 2 using polyphase networks and Gilbert mixers.
Figure 4:
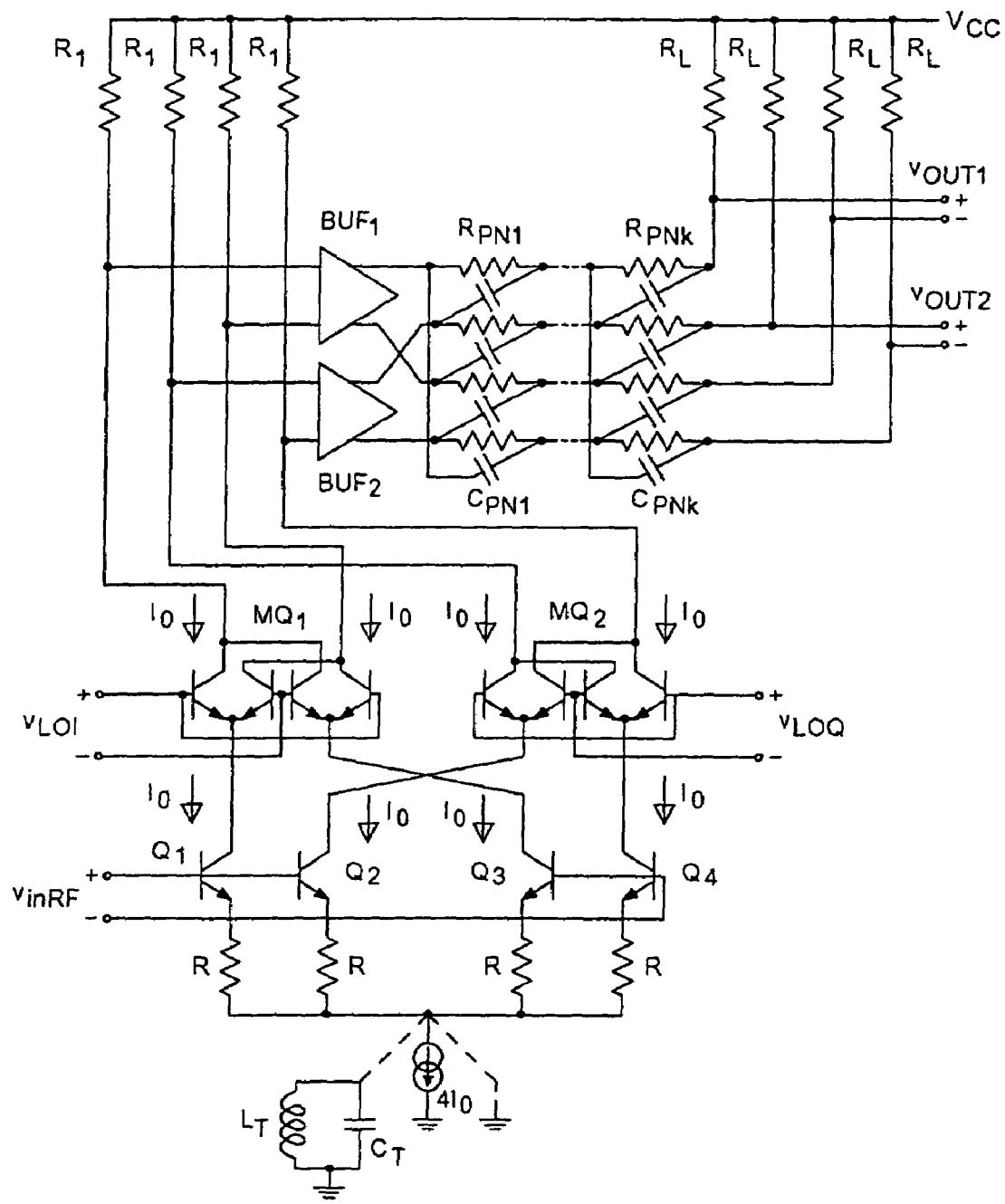
FIG. 4 is another implementation of the architecture in FIG. 2.
Figure 5:
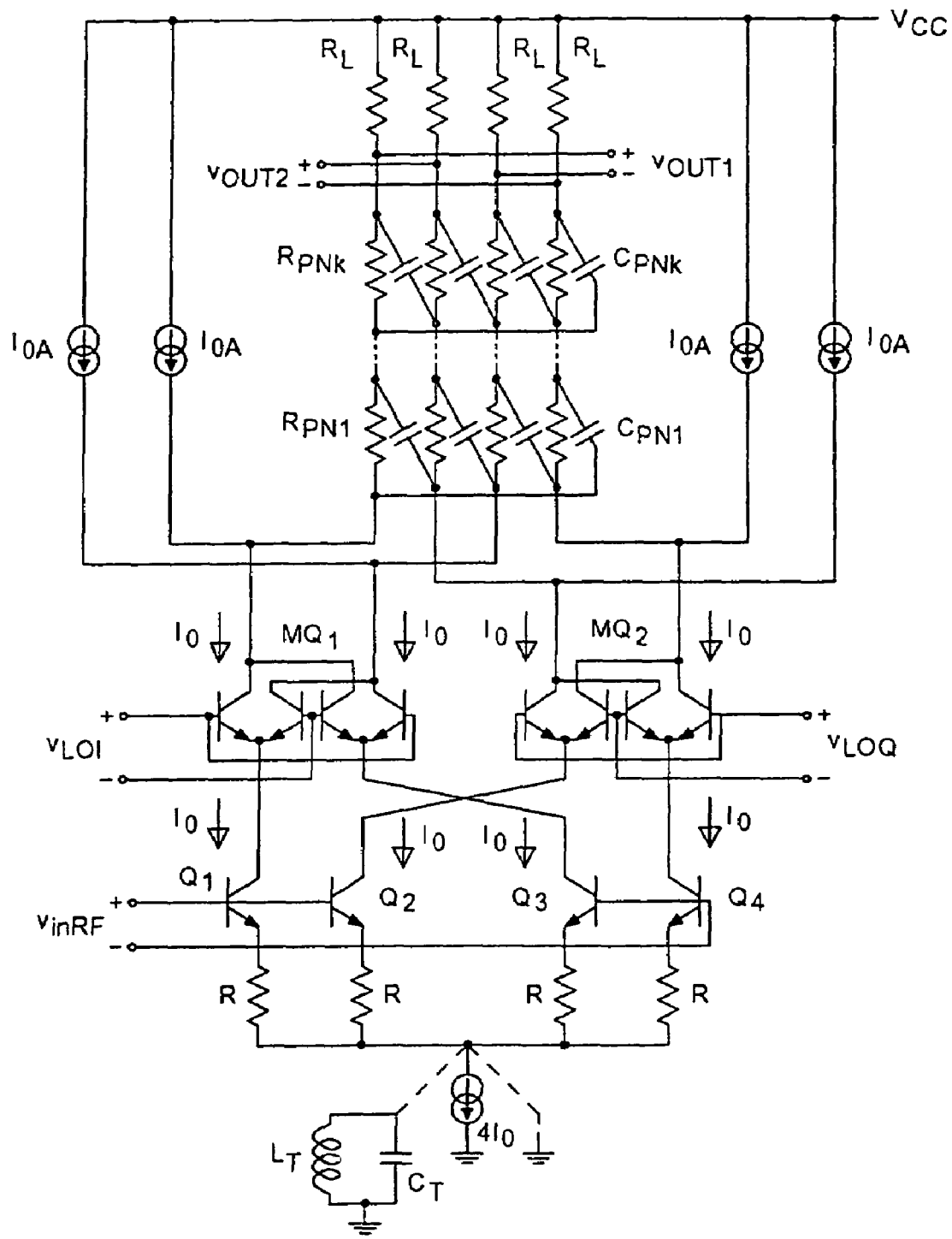
FIG. 5 is diagram illustrating a first embodiment of the present invention using output current sources for increasing the output headroom.

A first embodiment of the image-rejection mixer in accordance with the present invention is shown in FIG. 5. In this embodiment, the mixing cells (Gilbert mixers), the output polyphase network and the load resistors are connected, one on top of the other, as in FIGS. 3 and 4. In addition to the circuit shown in FIG. 3, the circuit of FIG. 5 has four identical current sources $I_{O4}$ whose main purpose is to prevent part of the DC currents flowing through the collectors of the mixing quads $MQ_1$ AND $MQ_2$ from flowing through the polyphase network $R_{PN1}$-$R_{PNk}$, $C_{PN1}$-$C_{PNk}$ and the load resistors $R_L$. In this way, even in cases where the supply voltage is relatively small (on the order of 3 V), the output stage of the image-rejection mixer can operate far from saturation and good linearity (IIP3) and high conversion gain can be achieved.

Figure 6:
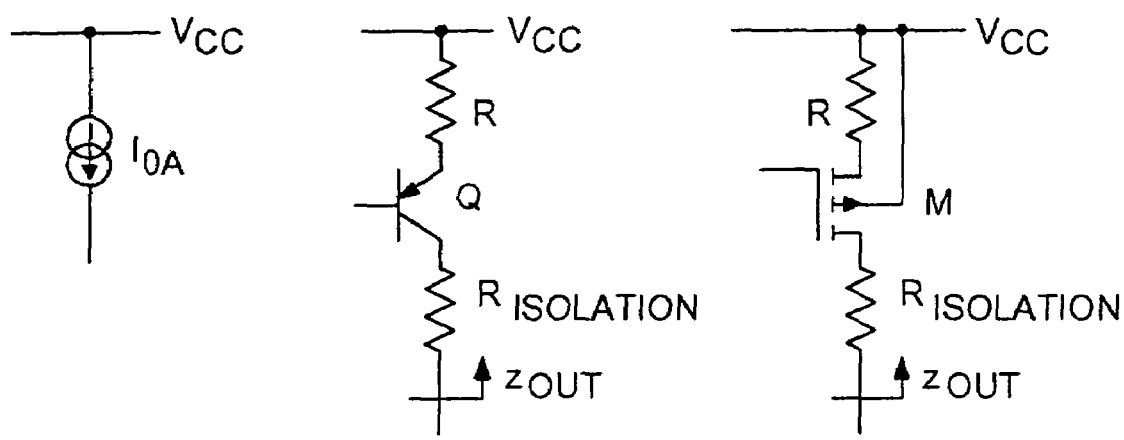
FIG. 6 is an implementation of the current sources in FIG. 5 using pnp or PMOS transistors.

The circuit of FIG. 5 can be used with good results in cases where the output frequency, or intermediate frequency (IF) of the mixer is less than several MHz or tens of MHz, and the current sources $I_{O4}$ can be implemented as shown in FIG. 6 by using active current-sourcing devices such as pnp or PMOS transistors. Although an optional isolation resistor $R_{ISOLATION}$ can be used to increase the output impedance (see U.S. Pat. No. 6,404,281 B1), the capacitive pnp or PMOS parasitics significantly degrade the high-frequency performance of these current sources in integrated circuits, resulting in a very small conversion gain for the image-rejection mixer. Therefore, at IF frequencies on the order of several hundred MHz or higher, alternative techniques must be found for effectively diverting the DC current of the output stage and preserving the high conversion gain of the mixer.

Figure 7:
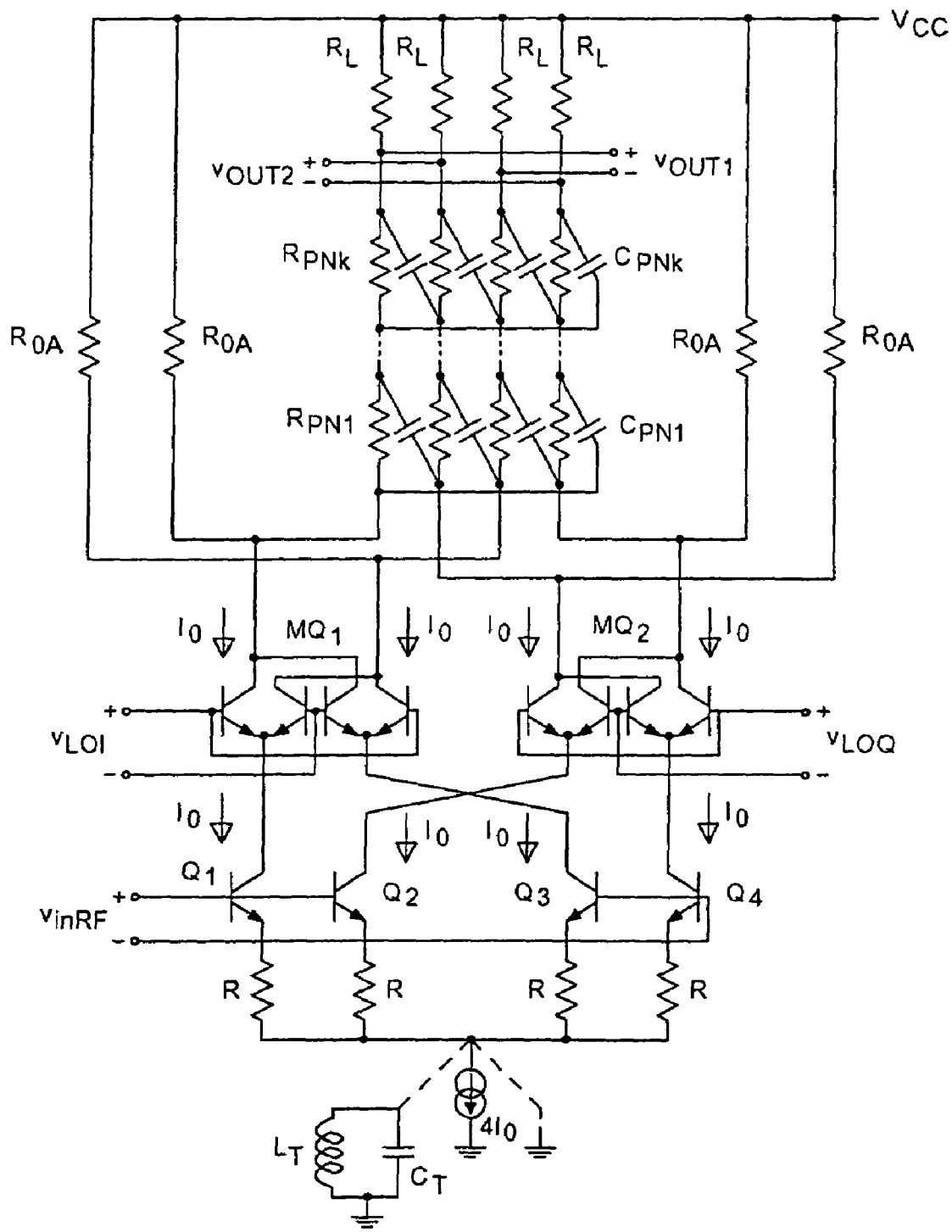
FIG. 7 is a diagram illustrating another embodiment of the present invention using resistors for increasing the output headroom.

FIG. 7 shows another embodiment of the invention in which the current sources in FIG. 5 are replaced by resistors $R_{O4}$. Resistors $R_{O4}$ do not exhibit the high-frequency degradation of the pnp or PMOS current sources, but they divert the signal as well as the DC current, resulting in a reduction in conversion gain.

Figure 8:
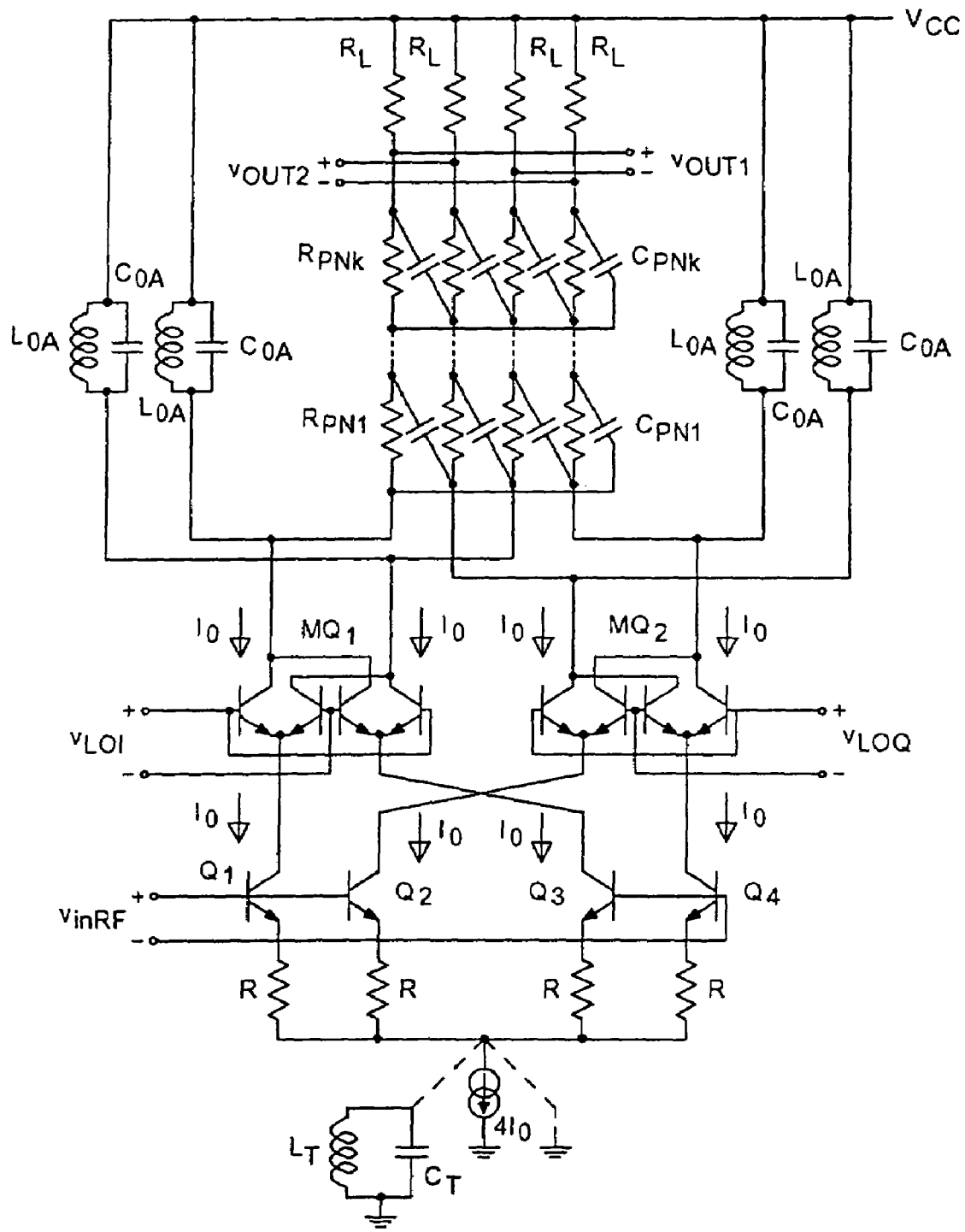
FIG. 8 is a diagram illustrating yet another embodiment of the present invention using tank circuits for increasing the output headroom.

FIG. 8 shows yet another embodiment of the invention, where the current sources $I_{O4}$ of FIG. 5 are replaced by tank circuits $L_{O4}$, $C_{O4}$, chosen such that their resonant frequency is the IF frequency. Although the headroom of the output stage is now the biggest (due to the inductors, the collector voltages of the mixing quads are practically equal to $V_{CC}$), the conversion gain of the image-rejection mixer is still relatively small at low IF frequencies because of the small quality factor of the integrated inductors. One alternative is to use external inductors $L_{O4}$ (with much better quality factors). Another drawback is the possibly impractical size of the inductors required at low IF frequencies.

Figure 9:
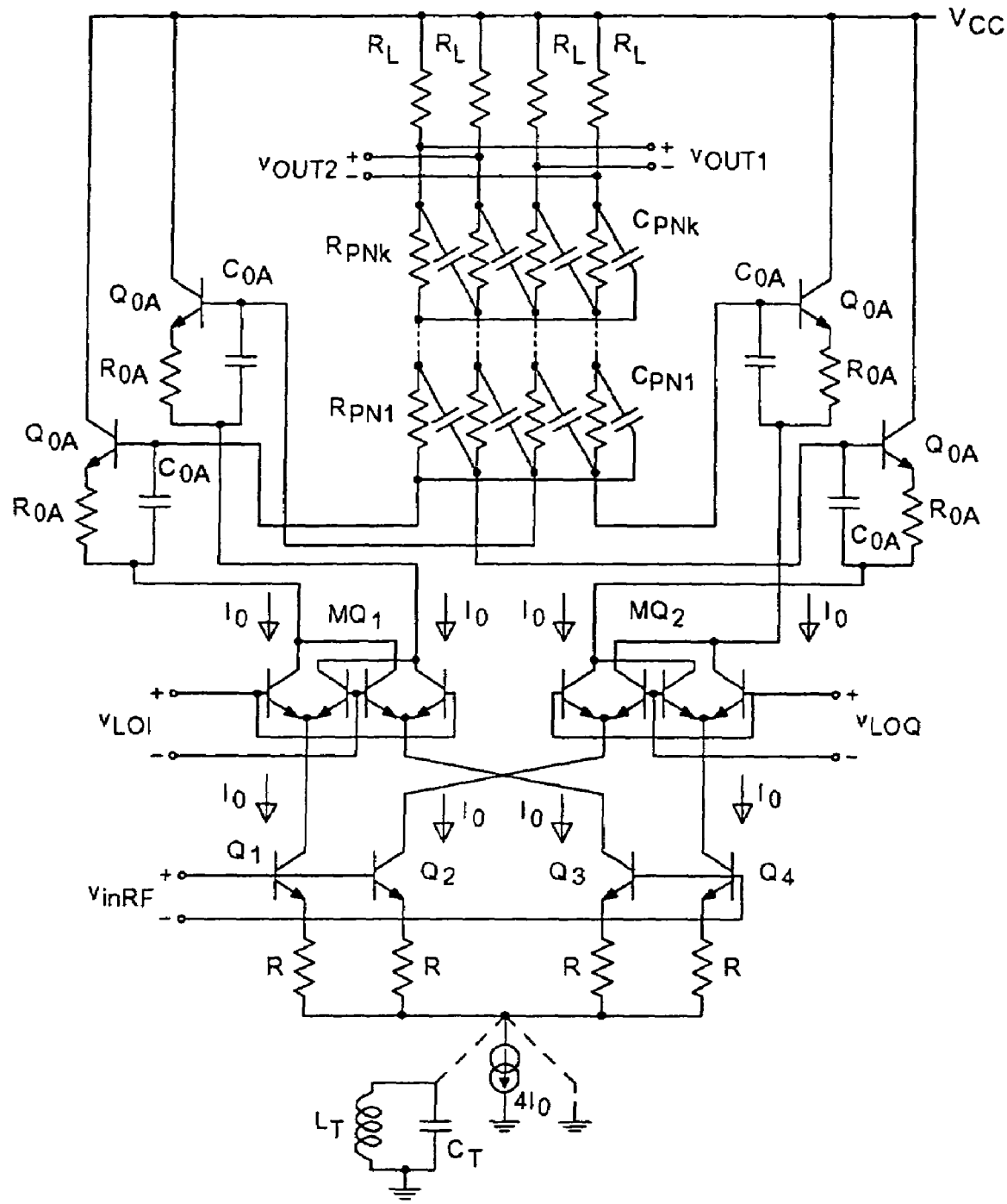
FIG. 9 is a diagram illustrating yet another embodiment of the present invention showing a DC current-diverting circuit using npn transistors.

FIG. 9 shows yet another embodiment of the invention, where the current sources $I_{O4}$ in FIG. 5 are implemented using npn devices $Q_{O4}$, optional degeneration resistors $R_{O4}$ (which may be absent or may be replaced with inductors), and bypass capacitors $C_{O4}$. Capacitors $C_{O4}$ are sufficiently large such that they can be considered short circuits (low impedance compared to the impedance of the multiphase network, such as, by way of example 10% or less of the impedance of the multiphase network, and more preferably 1% or less) at the frequency or frequency range of interest (IF) so that practically all of the output AC current flows through them and not though the $Q_{O4}$ devices. In order to reduce the size of capacitors $C_{O4}$ (several tens of pF are usually sufficient for IF frequencies on the order of several hundred MHz), degeneration resistors $R_{O4}$ can be employed, chosen such that $I_O R_{O4}$ is on the order of 100 mV (in order not to affect the output headroom). In this way, the DC currents flow through transistors $Q_{O4}$, and the AC output currents of the mixing quads $MQ_1$ and $MQ_2$ flow unattenuated into the output polyphase network and the mixer load. Only the base currents from the $Q_{O4}$ devices ($I_o/\beta$) now flow through the output polyphase network and the load resistance, causing a negligible reduction in the output headroom. The output headroom is determined by $V_{CC}$, one transistor $V_{BE}$, and the small DC voltage drop across $R_{O4}$ (no DC voltage drop if inductors are used in lieu of resistors), and is usually sufficient for ensuring superior linearity for the image-rejection mixer. The conversion gain of the image-rejection mixer is high because practically the entire output current of the mixing quads $MQ_1$ and $MQ_2$ flows into the output polyphase network. Due to this current-diverting technique, the DC output levels of the mixer are practically at $V_{CC}$ and are not a function of the load resistances $R_L$. The conversion gain of the image-rejection mixer can be changed by changing $R_L$ (the gain can be changed between the maximum value for very large $R_L$ and practically zero for $R_L$=0). Improving the image-rejection performance of the mixer in a sufficiently wide IF band is a relatively easy task using the circuit of FIG. 9 because the output polyphase network can be designed independent of linearity considerations.

Figure 10:
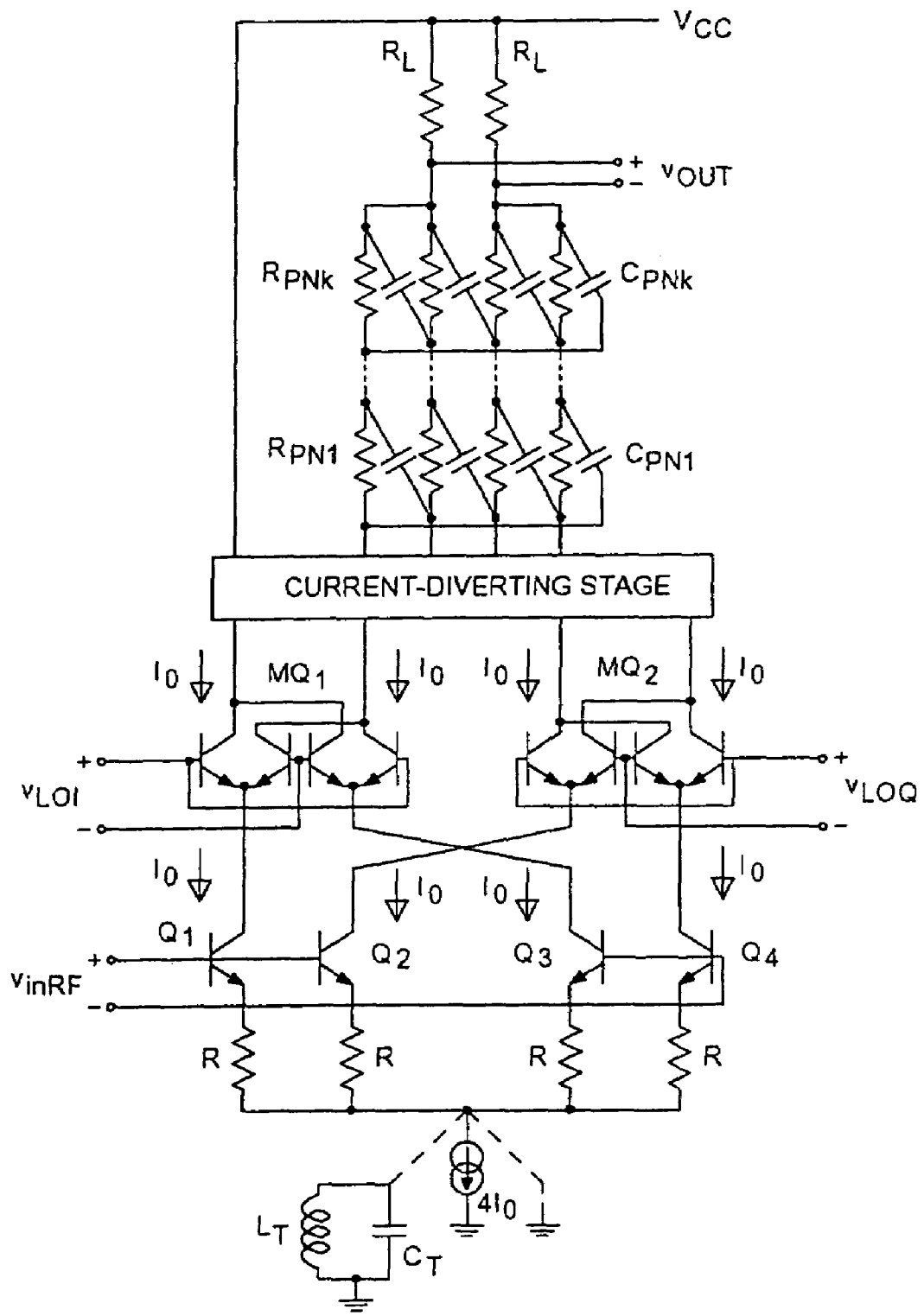
FIG. 10 is a diagram illustrating yet another embodiment of the present invention showing shorted pairwise outputs for the output polyphase network and a current-diverting stage similar to the current-diverting stages shown in FIGS. 5, 7, 8, and 9.

FIG. 10 shows yet another embodiment of the invention wherein the output polyphase network has shorted pairwise outputs for less sensitivity to load capacitance mismatch. The current-diverting stage consists either of the current sources $I_{Q4}$ in FIG. 5, the resistors $R_{Q4}$ in FIG. 7, the tank circuits $L_{Q4}$, $C_{Q4}$ in FIG. 8, or the npn transistors $Q_{Q4}$, degeneration resistors $R_{Q4}$ and bypass capacitors $C_{Q4}$ in FIG. 9. As a minimum, the current-diverting stage should provide a DC current path or act as a DC current source from the power supply to the Gilbert mixers, and more preferably will provide such a path or source while presenting a high impedance path to IF frequencies from the Gilbert mixers to direct the IF frequency signal through the multiphase network.

The mixers of the present invention hereinbefore described are well suited to use for downshifting an RF signal to provide an IF signal wherein the RF signal includes image frequency components, though of course may be used in other applications as well. Another embodiment for upshifting from baseband to RF may be seen in FIG. 11. This embodiment allows a direct upconversion double quadrature mixer to be stacked with an RF VGA (variable gain amplifier) and load tank circuit by using an R-C/R-6C single pole current mode signal path I/Q combiner and employing a common base stage as both the I/Q combiner termination and the VGA control point. This provides a significant saving in operating current compared to separate upconverter/polyphase filters and VGA, and 6 dB higher gain than the classical 2nd Order polyphase method due to the use if the single pole R-C/R-6C polyphase circuit.

Figure 11:
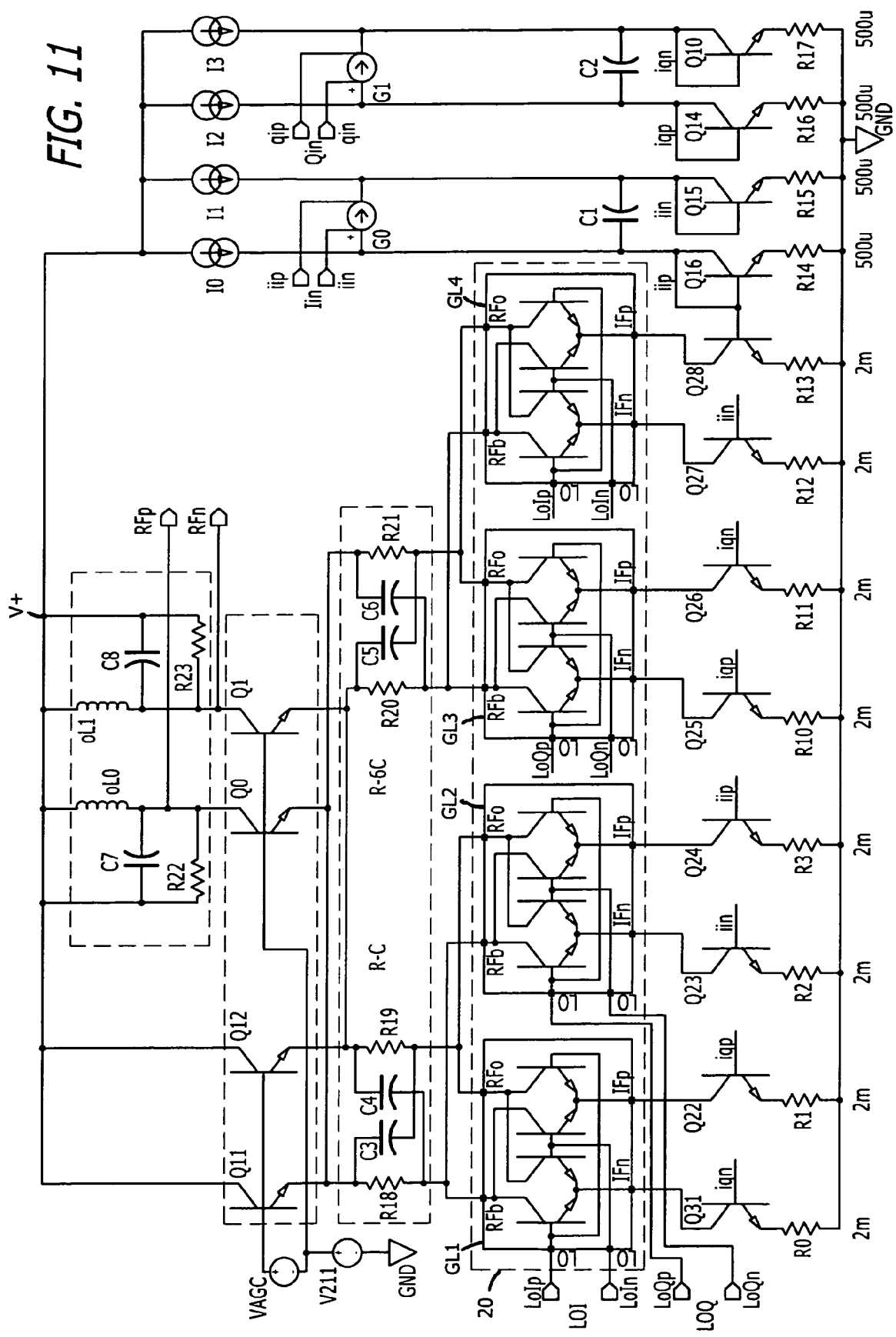
FIG. 11 illustrates another embodiment for upshifting from baseband to RF.

In FIG. 11, the four Mixer Blocks GL1 through GL4 within the dashed line 20 are standard double balanced Gilbert cell cores (i.e., four NPN transistors in each cell). The I and Q input currents for these blocks are provided by NPN current mirrors from a baseband voltage to current stage (not shown) providing the input current Iin (iip and iin). These input currents modulate the bias currents I0 through I3, which modulated currents are mirrored by diode connected transistors Q16, Q15, Q14 and Q10 to transistors Q31 and Q22 through Q28. The current mirror transistors have proportional emitter degeneration resistors R0 through R3 and R10 through R17. The capacitors C1 and C2 across the I and Q NPN mirror transistors may be used to create a real pole that reduces the mirror and any baseband noise. For a baseband bandwidth up to 8 MHz, 15 pF capacitors may be used to create a real pole at 17.5 MHz.

In a specific embodiment, the I and Q Local Oscillator (LO) drive signals LOI (LoIp and LoIn) and LON (LoQp and LoQn) for the Gilbert mixers are provided from a quadrature LO generator using a divide by 2 from an oscillator operating at twice the desired RF frequency (or other circuits such as a polyphase network may be used) at a common mode voltage of 1.45V. In FIG. 11, the input signals and the local oscillator signals provided to the Gilbert mixers are phased so that the resulting currents at the output of each pair of commonly connected image reject upconverters are in-phase and quadrature signals of the upper sideband (RF+baseband), the image frequencies of the lower sideband (RF−baseband) being rejected.

These RF I and Q signals are then quadrature summed in the R-C/R-6C current mode I/Q combiner network. This circuit needs to see a low impedance to give maximum gain and image rejection, which is implemented using the common base stage NPN devices Q0/Q1 and Q11/Q12.

The common base stage also serves as the point at which an RF VGA (variable gain amplifier) function can be implemented. This may be done by fixing the base voltage (V211) of transistors Q0 and Q1 (the signal arm), in one embodiment at 2.5V, and controlling the base voltage (VAGC) of transistors Q11 and Q12 relative to the fixed voltage, thereby controlling the dump current.

The VGA control voltage VAGC may, by way of example, be generated by a circuit consisting of a VGA reference pair of transistors matched to transistors Q0/Q1 and Q11/Q12, with a forced DC imbalance current set to the appropriate gain by the output of a log DAC. The base voltages for the reference pair are then generated by a closed loop opamp circuit and the same voltages are used to drive the main VGA (transistors Q0/Q1 and Q11/Q12). The common base stage (transistors Q0/Q1) conveys the double quad combined signal current into the tank circuit load (inductors oL0 and oL1, capacitors C7 and C8 and resistors R22 and R23. The overall image rejection for this double quadrature circuit is some 20 dB better than the combined IQ accuracy of the local oscillator generation of the I and Q signals and the R-C/R-6C image rejection.

The R-C/R-6C polyphase network is a simple differential R-C filter (current mode) with in line R's and cross coupled C's for the I Channel and R's with 6 C's for the Q Channel. This 6:1 scaling of the R's yields an I to Q combination network that gives an accurate (<30 dB) image rejection ratio across a −30 to +30% frequency band but doesn't have the usual 6 dB signal path loss of a full polyphase Network.

Figure 12:
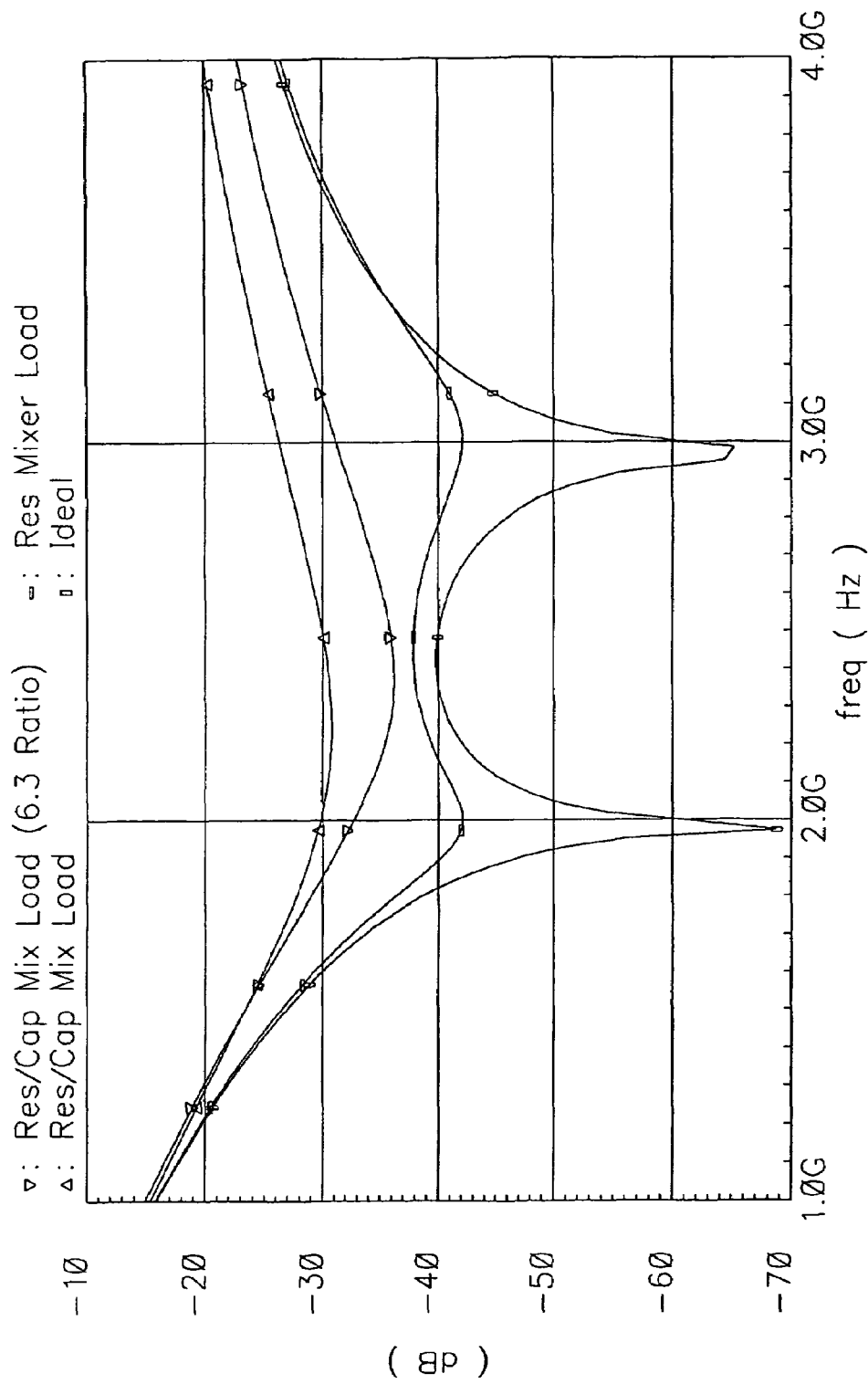
FIG. 12 presents curves illustrating the image rejection achievable versus frequency for an implementation in accordance with FIG. 11.

Now referring to FIG. 12, curves illustrating the image rejection achievable versus frequency for an implementation in accordance with the FIG. 11, given various assumed conditions, may be seen. For these curves, the approximately R-C/R-6C network has a more precise ratio of R-C/R-6.3C. As can be seen from the plot, even with the effects of the finite RF mixer loads on the unbalanced R-C and R-6C structure, a network Image Combination of better than 32 dB from 2-3 GHz can be achieved. Assuming at least 32 dB from the LO I & Q source, then an overall Double Quadrature Upconversion Image Rejection of >50 dB will be achieved. (This assumes ideal I & Q Baseband Signals.)

While certain preferred embodiments of the present invention have been disclosed herein, such disclosure is only for purposes of understanding exemplary embodiments and not by way of limitation of the invention. It will be obvious to those skilled in the art that various changes in form and detail may be made in the invention without departing from the spirit and scope of the invention as set out in the full scope of the following claims.

What is claimed is:

1. A converter comprising:
   first and second Gilbert mixers coupled to a first power supply terminal;
   a polyphase network coupled to each of the first and second Gilbert mixers, outputs of the polyphase networks being coupled together;
   first and second transistor pairs, the first transistor pair being coupled between the polyphase network outputs and a second power supply terminal, the second transistor pair being coupled to the polyphase network outputs and through tank circuits to the second power supply terminal;
   the first and second transistor pairs being controlled by a differential gain control signal to control the amount of the polyphase network output directed to the tank circuits.

2. The converter of claim 1 wherein the polyphase networks are R-C, R-6C networks.

3. The converter of claim 2 further comprised of current mirrors coupled between the first power supply terminal and the Gilbert mixers to mirror inphase and quadrature signals to the Gilbert mixers.

4. A converter comprising:
   a double quadrature mixer;

current mirrors coupled between the double quadrature mixer and a first power supply terminal to mirror I and Q signals to the double quadrature mixer;

R-C, R-6C polyphase networks coupled to an output of the double quadrature mixer, the polyphase networks having their outputs coupled together;

first and second transistor pairs, the first transistor pair being coupled between the polyphase network outputs and a second power supply terminal, the second transistor pair being coupled to the polyphase network outputs and through tank circuits to the second power supply terminal;

the first and second transistor pairs being controlled by a differential gain control signal to control the amount of the polyphase network output directed to the tank circuits.

* * * * *